(12) United States Patent
Yang

(10) Patent No.: US 10,707,640 B2
(45) Date of Patent: Jul. 7, 2020

(54) LASER-HEATED CAVITY SYSTEM

(71) Applicant: Adnanotek Corp., New Taipei (TW)

(72) Inventor: Kai Yang, New Taipei (TW)

(73) Assignee: ADNANOTEK CORP., New Taipei (TW)

( * ) Notice: Subject to any disclaimer, the term of this patent is extended or adjusted under 35 U.S.C. 154(b) by 0 days.

(21) Appl. No.: 16/356,324

(22) Filed: Mar. 18, 2019

(65) Prior Publication Data

US 2020/0106236 A1    Apr. 2, 2020

(30) Foreign Application Priority Data

Sep. 28, 2018    (CN) .......................... 2018 1 1139865

(51) Int. Cl.

| | |
|---|---|
| *H01S 3/0951* | (2006.01) |
| *H01S 3/034* | (2006.01) |
| *H01S 3/22* | (2006.01) |
| *H01S 3/041* | (2006.01) |
| *H01S 3/036* | (2006.01) |
| *C23C 16/48* | (2006.01) |
| *C23C 14/58* | (2006.01) |
| *H01S 5/42* | (2006.01) |

(52) U.S. Cl.
CPC ........ *H01S 3/0951* (2013.01); *C23C 14/5813* (2013.01); *C23C 16/483* (2013.01); *H01S 3/034* (2013.01); *H01S 3/036* (2013.01); *H01S 3/041* (2013.01); *H01S 3/22* (2013.01); *H01S 5/423* (2013.01)

(58) Field of Classification Search
CPC .......... H01S 3/0951; H01S 5/423; H01S 3/22; H01S 3/041; H01S 3/036; H01S 3/034; C23C 14/5813; C23C 16/483
See application file for complete search history.

(56) References Cited

U.S. PATENT DOCUMENTS

| | | | | |
|---|---|---|---|---|
| 4,283,935 | A  * | 8/1981 | Eguchi .................. | G01N 25/18 374/44 |
| 5,174,826 | A  * | 12/1992 | Mannava .............. | C23C 16/047 118/715 |
| 2005/0269030 | A1 * | 12/2005 | Kent .................. | H01L 21/67178 156/345.31 |
| 2006/0213439 | A1 * | 9/2006 | Ishizaka .............. | C23C 16/4401 118/715 |

(Continued)

*Primary Examiner* — Yuanda Zhang
(74) *Attorney, Agent, or Firm* — Li & Cai Intellectual Property (USA) Office

(57) ABSTRACT

A laser-heated cavity system includes: a first cavity provided with a first top end part and a first bottom end part that are arranged opposite each other; wherein the first top end part is provided with a first widow and the first bottom end part is provided with an opening; a second cavity disposed inside the first cavity, provided with a second top end part and a second bottom end part that are arranged opposite each other, and disposed with a second window and a sample bearer; a laser heating assembly disposed outside the first cavity; wherein at least one laser beam provided by the laser heating assembly is passed through the first and second windows, and then focused on the sample bearer; and a mobile platform assembly. The first cavity is a vacuum cavity, and the pressure in the second cavity ranges from vacuum to 30 atm.

11 Claims, 3 Drawing Sheets

(56) References Cited

U.S. PATENT DOCUMENTS

2014/0268050 A1* 9/2014 Jayaraman ........... A61B 3/0008
  351/206
2017/0011917 A1* 1/2017 Srinivasan ........ H01L 21/67028
2018/0135181 A1* 5/2018 Yang ..................... C23C 16/483
2018/0142355 A1* 5/2018 Yang ....................... C23C 16/50

* cited by examiner

LASER-HEATED CAVITY SYSTEM

BACKGROUND OF THE INVENTION

1. Field of the Invention

The present invention relates to a laser-heated cavity system, and in particular, to a laser-heated cavity system for a catalytic reaction, surface science and surface analysis.

2. Description of Related Art

A catalytic reaction is a process of altering the rate of a chemical reaction by using a catalyst, so as to achieve a preferred reaction rate or rate of production. The catalytic reaction is the key to many chemical reactions for implementation of industry applications. At present, catalysis technique is widely applied to the production of chemical products. However, application conditions of the catalyst are rather complicated in industrial production, and the activity of the catalyst is affected by different conditions together. Usually, high temperature and high pressure are necessary conditions to achieve a high catalytic rate. Therefore, a cavity for the catalytic reaction needs to be designed to withstand both the high temperature for sample heating and the high pressure of gas used to fill the cavity.

A heating manner for current reaction cavities mainly depends on an electric filament, and the sample is heated to reach a required reaction temperature, to induce catalysis. However, the filament is really active in high temperature with Oxygen or other reaction gas, and is very easy to suffer damage in high temperature. More when the electric filament for heating is mounted inside the reaction cavity, it is required to use an insulation material to insulate the electric filament from the wall of the reaction cavity, so as to avoid electric leakage when the power is on. The pressure limit of the insulation material makes it impossible to increase the pressure in the reaction cavity to an expected level. Moreover, because the electric filament has limited service life and is unable to put all output power into sample heating, the temperature the sample can reach is also limited to a certain degree.

To increase the temperature in the reaction cavity and the gas pressure during the process, a novel cavity system is required.

SUMMARY OF THE INVENTION

A technical problem to be solved by the present invention is to provide a laser-heated cavity system. The laser-heated cavity system includes: a first cavity, provided with a first top end part and a first bottom end part that are arranged opposite each other, a first lateral end part between the first top end part and the first bottom end part, and a second lateral end part arranged opposite the first lateral end part, wherein the first cavity has a first window and the first bottom end part is provided with an opening; a second cavity disposed inside the first cavity, and having a sample delivery opening or opened from its bottom end part to deliver a sample (this arrangement is not shown in the figure), wherein the second cavity is provided with a second top end part and a second bottom end part that are arranged opposite each other, the second cavity has a second window and a sample bearer arranged on the second bottom end part to bear a sample; a laser heating assembly, disposed outside the first cavity, wherein at least one laser beam provided by the laser heating assembly is passed through the first window and the second window, and then focused on the sample bearer; and a mobile platform assembly, including a platform and a mobile mechanism connected to the platform, wherein the platform is disposed below the second bottom end part, to bear the second cavity, and the mobile mechanism is disposed through the opening on the first bottom end part to raise/lower the platform; the first cavity is a vacuum cavity, and the pressure in the second cavity ranges from vacuum to 30 atm, for example, from $10^{-6}$ atm to 30 atm.

Further, the laser-heated cavity system also includes a sample transfer assembly, wherein the sample transfer assembly is provided with an input end coupled to the first lateral end part of the first cavity and an output end coupled to the second lateral end part of the first cavity, and the input end is provided with a transfer rail and a transfer arm disposed on the transfer rail, to move the sample to the output end.

Further, the laser-heated cavity system also includes a pressure regulating valve, connected to the first cavity to control the pressure inside the first cavity.

Further, the laser-heated cavity system also includes a cooling pipeline, disposed in the mobile platform assembly, communicated with the second cavity, and used to cool the sample.

Further, the first cavity also includes a first gas inlet pipe and a first gas outlet pipe, and the second cavity also includes a second gas inlet pipe and a second gas outlet pipe.

Further, the first window is disposed on the first top end part, and the second window is disposed on the second top end part.

Further, the laser heating assembly includes: at least two vertical cavity surface emitting lasers, used to vertically emit laser beams; and a laser adjusting mechanism, connected to the vertical cavity surface emitting lasers to adjust an emission angle of the laser beam.

Further, the laser adjusting mechanism includes two fixing ends opposite to each other, which are used to fix the vertical cavity surface emitting lasers, such that the laser beams are mutually unparallel.

Further, the laser heating assembly includes six vertical cavity surface emitting lasers that are arranged on the two opposite fixing ends in groups of three in an arc.

Further, the first cavity is made from iron alloy which contains chrome whose content accounts for 10 wt % to 30 wt % of the total weight percentage.

In order to further understand the features and technical contents of the present invention, reference is made to the following detailed description of the present invention and the accompanying drawings. The drawings are provided for the purpose of reference and description only and are not intended to limit the present invention.

DETAILED DESCRIPTION OF THE PREFERRED EMBODIMENTS

The following describes an implementation manner of a "laser-heated cavity system" disclosed by the present invention with specific embodiments. Those skilled in the art can understand the advantages and effects of the present invention from the content disclosed in the specification. The present invention can be embodied or applied through other different embodiments. Based on different opinions and applications, the details of the specification can also be modified and changed without departing from the concept of the present invention. In addition, the accompanying drawings of the present invention are merely for brief illustration and not drawn according to actual dimensions. The following embodiments will further explain the related technical content of the present invention, but the disclosure is not intended to limit the protection scope of the present invention.

Figure 1:
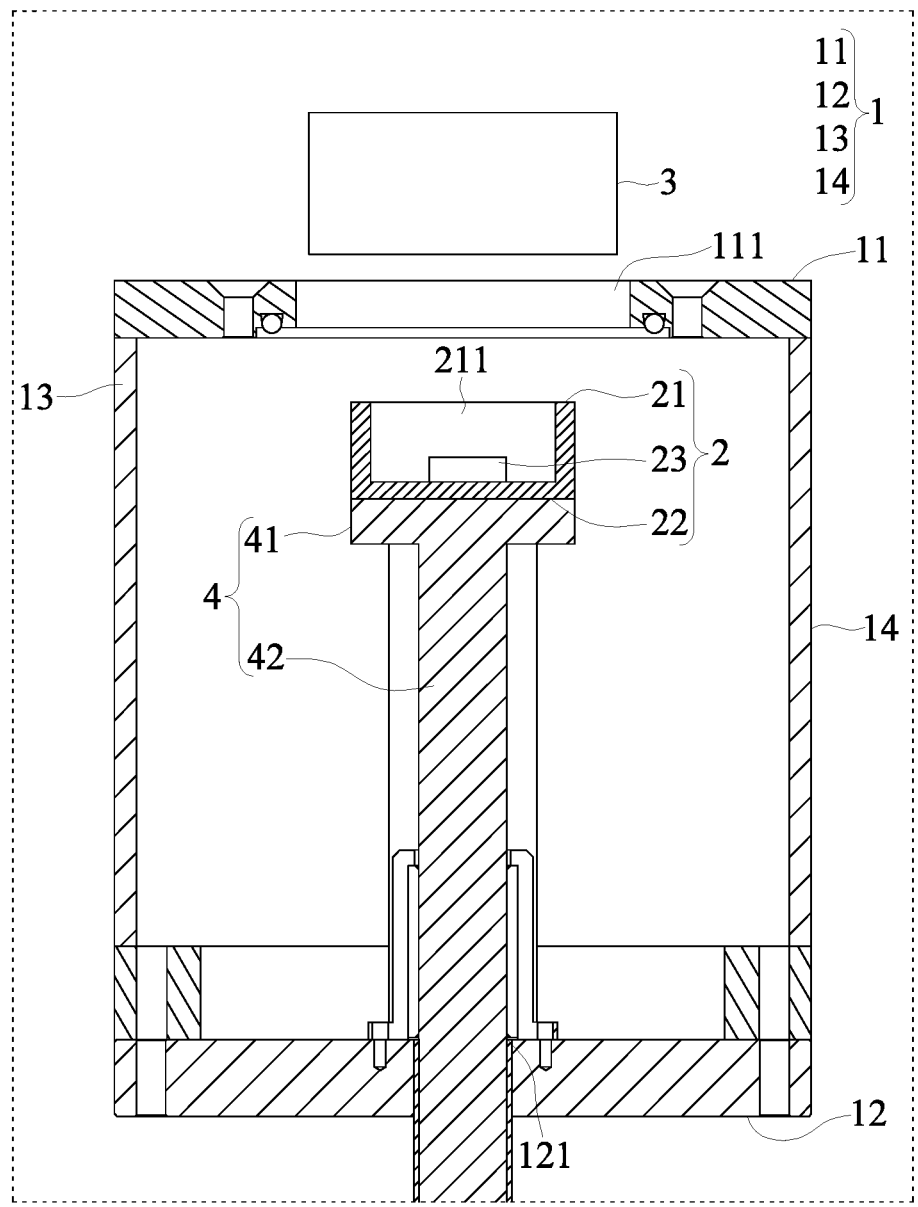
FIG. 1 is a sectional diagram illustrating a laser-heated cavity system according to an embodiment of the present invention.

A technical problem to be solved by the present invention is to provide a laser-heated cavity system S, as shown in FIG. 1. The laser-heated cavity system S in a specific embodiment of the present invention includes: a first cavity 1, a second cavity 2, a laser heating assembly 3, and a mobile platform assembly 4. Specifically, the first cavity 1 is provided with a first top end part 11 and a first bottom end part 12 that are arranged opposite each other, a first lateral end part 13 between the first top end part 11 and the first bottom end part 12, and a second lateral end part 14 arranged opposite the first lateral end part 13. The first top end part 11 is provided with a first window 111, the first bottom end part 12 is provided with an opening 121, wherein the shape of the opening 121 is determined according to a mobile mechanism 42 of the mobile platform assembly 4. For example, the first cavity may be a cuboid, a cube, or a cylinder. The first cavity 1 is a vacuum cavity, and a preferred pressure inside the vacuum cavity may range from $10^{-6}$ mmHg to 25 mmHg. More specifically, the first cavity 1 may be made from iron alloy which contains chrome whose content accounts for 10 wt % to 30 wt % of the total weight percentage. For example, the first cavity 1 may be made from stainless steel, and the low outgassing rate of the stainless steel maintains the first cavity 1 at high vacuum.

The second cavity 2 is disposed inside the first cavity 1, and is not communicated with the first cavity 1. The second cavity 2 has a sample delivery opening, or a second bottom end part 22 of the second cavity 2 can be opened (this arrangement is not shown in the figure) to deliver a sample. The second cavity 2 is provided with a second top end part 21 and a second bottom end part 22 that are arranged opposite each other. The second top end part 21 is provided with a second window 211. Moreover, a sample bearer 23 is additionally disposed inside the second cavity 2, and arranged on the second bottom end part 22 to bear the sample. Specifically, the second cavity 2 is a high-pressure cavity, and the pressure in the second cavity 2 ranges from vacuum to 30 atm, which may specifically be $10^{-6}$ atm to 30 atm.

The laser heating assembly 3 is disposed outside the first cavity 1 and adjoins the first window 111. At least one laser beam provided by the laser heating assembly 3 is passed through the first window 111 and the second window 211, and then focused on the sample bearer 23, to heat the sample. However, the position of the laser heating assembly 3 is not limited to the present invention, and it may also be disposed on the first bottom end part 12 to provide at least one laser beam to the sample bearer 23. The first window 111 of the first cavity 1 and the second window 211 of the second cavity 2 may be adjusted correspondingly, to form additional corresponding windows to facility focus of the laser.

The mobile platform assembly 4 includes a platform 41 and a mobile mechanism 42 connected to the platform 41. The platform 41 is disposed below the second bottom end part 22 of the second cavity 2, to bear the second cavity 2. The mobile mechanism 42 is disposed through the opening 121 on the first bottom end part 12 to raise/lower the platform 41. The size and shape of the mobile platform assembly 4 are not limited by the present invention. The platform 41 may also be a non-solid support (not shown in the figure), to facilitate adjustment as the position of the laser heating assembly 3 varies.

Figure 2:
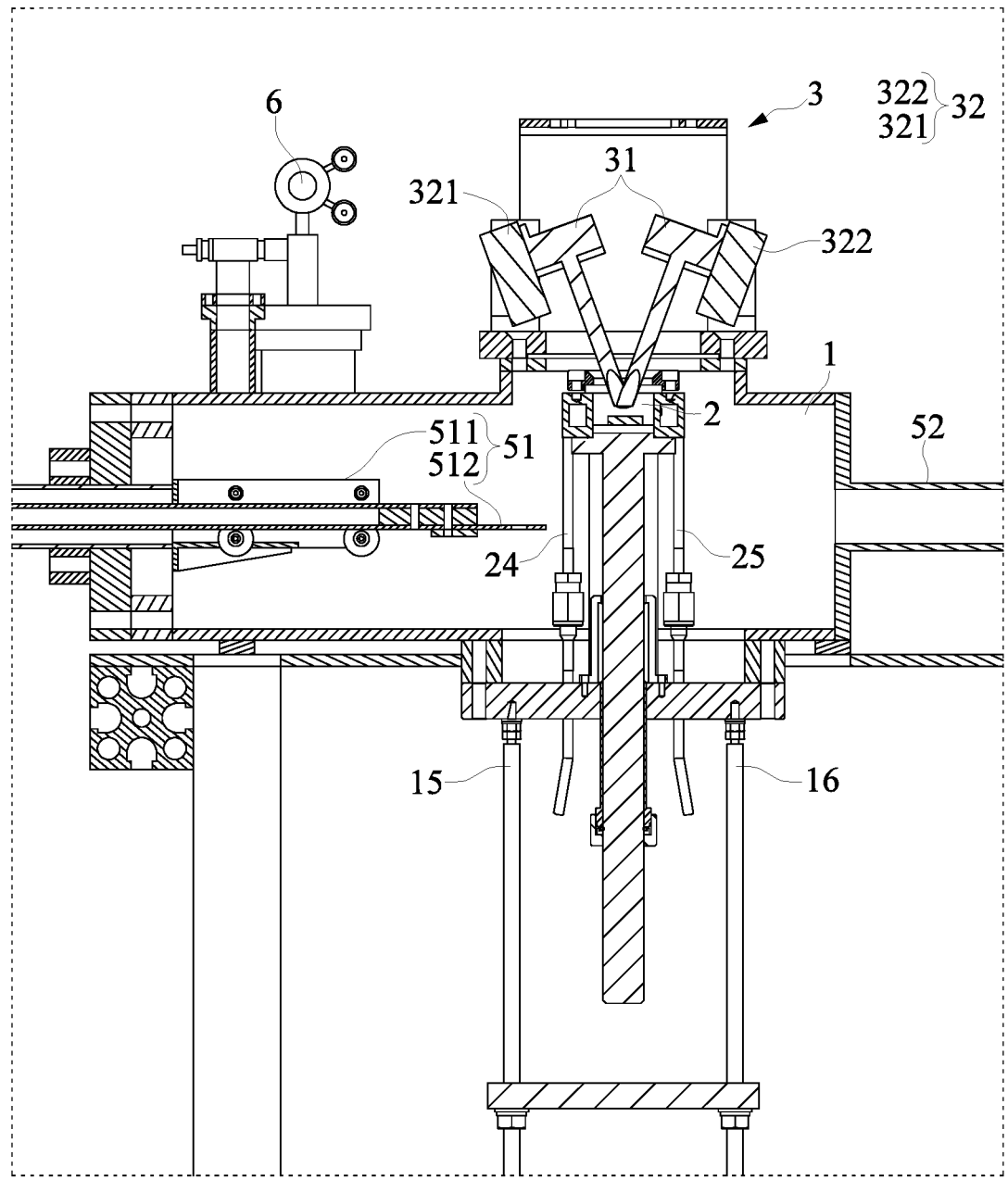
FIG. 2 is a sectional diagram illustrating a laser-heated cavity system according to another embodiment of the present invention.

Further, reference is made to FIG. 2, which shows a laser-heated cavity system S' in another specific embodiment of the present invention. The cavity system S' includes a first cavity 1, a second cavity 2, a laser heating assembly 3, and a mobile platform assembly 4; and further includes a sample transfer assembly 5. The sample transfer assembly 5 is provided with an input end 51 connected to the first lateral end part 13 of the first cavity 1 and an output end 52 connected to a second lateral end part 14 of the first cavity 1. The input end 51 is provided with a transfer rail 511 and a transfer arm 512 disposed on the transfer rail 511, to move a sample to the sample bearer 23 or move a sample having subjected to reaction to the output end 51. Moreover, the second cavity 2 can be opened from the second bottom end part 22, to facilitate the sample transfer assembly 5 to transfer the sample.

Furthermore, the laser-heated cavity system S' of the present invention also includes a pressure regulating valve 6 and a cooling pipeline (not shown in the figure). The pressure regulating valve 6 is connected to the first cavity 1 and used to control the pressure inside the first cavity 1, such that the first cavity 1 achieves a vacuum state. The cooling pipeline is disposed in the mobile platform assembly 4, communicated with the second cavity 2, and used to cool the sample. In addition, the first cavity 1 also includes a first gas inlet pipe 15 and a first gas outlet pipe 16 that may be both electrically connected to a control device, such as the pressure regulating valve 6, to control the gas in the first cavity 1 to achieve an expected pressure. The second cavity 2 also includes a second gas inlet pipe 24 and a second gas outlet pipe 25 that may be both electrically connected to the control device, to control the gas in the second cavity 2 to achieve an expected pressure.

More specifically, the laser heating assembly 3 includes at least two vertical cavity surface emitting lasers 31 and a laser adjusting mechanism 32. The vertical cavity surface emitting lasers 31 can vertically emit laser beams, and the laser adjusting mechanism 32 is connected to the vertical cavity surface emitting lasers 31 to adjust an emission angle of the laser beam. Further, the laser adjusting mechanism 32 includes two fixing ends 321 and 322 opposite to each other, which are respectively used to fix the at least two vertical cavity surface emitting lasers 31, such that the laser beams emitted from the vertical cavity surface emitting lasers 31 are mutually unparallel. Generally speaking, the laser heating assembly 3 may be provided with two, four, six, or eight vertical cavity surface emitting lasers 31 that are fixed on the opposite fixing ends 321 and 322 in a one-to-one correspondence manner. These vertical cavity surface emitting lasers 31 can emit unparallel laser beams at corresponding emission angles, and focus the laser beams on the sample. The laser heating assembly 3 may be disposed beside the first top end part 11, or an extra laser heating assembly may be additionally disposed beside the first bottom end part 12.

Figure 3:
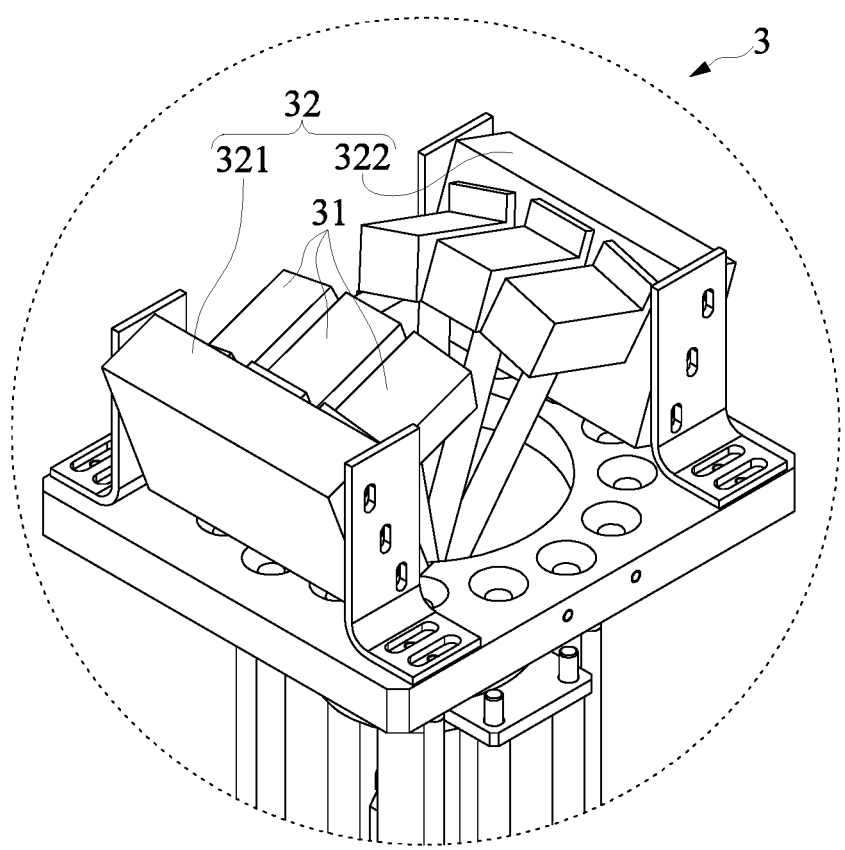
FIG. 3 is a schematic diagram of a laser heating assembly of the laser-heated cavity system according to another embodiment of the present invention.

Further, reference is made to FIG. 3, which is a schematic diagram of a laser heating assembly 3. The laser heating assembly 3 includes six vertical cavity surface emitting lasers 31. Three of the vertical cavity surface emitting lasers 31 are disposed on the fixing end 321 and arranged in an arc in a direction facing the fixing end 321, and the other three are disposed on the fixing end 322 at the opposite side and arranged also in an arc in a direction facing the fixing end 322. Such an arrangement and design can achieve a preferred focusing and heating effect, and can provide preferred heating uniformity.

By use of the laser-heated cavity system S of the present invention, the sample can be heated to exceed 1000° C., and the pressure of gas used to fill the second cavity can reach 30 atm.

Beneficial Effects of the Present Invention

To sum up, the beneficial effects of the present invention are as follows: In a laser-heated cavity system S provided by the embodiment of the present invention, a second cavity is disposed inside a first cavity and not communicated with the first cavity, and at least one laser beam provided by a laser heating assembly is passed through a first window and a second window, and then focused on a sample bearer. By such a structural design, a high-temperature and high-pressure reaction chamber fit for a catalytic reaction is provided. Specifically, the second cavity of the present invention is disposed inside the first cavity, to provide a reaction chamber fit for the catalytic reaction, and the first cavity in a vacuum state reduces the safety risk in the catalytic reaction.

Moreover, the laser heating assembly used in the present invention replaces a conventional tungsten-filament heating apparatus, and focuses laser beams on the surface of a sample according to the laser focusable characteristics, so as to efficiently raise the temperature of the sample, such that the sample can be heated to exceed 1000° C. The laser-heated cavity system of the present invention is completely independent of the reaction chamber, overcoming the shortcomings of the tungsten-filament heating apparatus, and avoiding problems in service life and power loss. Moreover, the present invention dispenses with an insulation material additionally disposed due to the use of the conventional tungsten-filament heating apparatus. Thus, the pressure in the reaction cavity can be further enhanced, such that the pressure of gas used to fill the reaction cavity can reach near 30 atm.

The foregoing disclosed content merely describes the preferred feasible embodiments of the present invention, but is not intended to limit the protection scope of claims of the present invention. Any equivalent technical changes made based on the specification and accompanying drawings of the present invention shall fall within the protection scope of the claims of the present invention.

What is claimed is:

1. A laser-heated cavity system, comprising:
a first cavity, provided with a first top end part and a first bottom end part that are arranged opposite each other, a first lateral end part between the first top end part and the first bottom end part, and a second lateral end part arranged opposite the first lateral end part, wherein the first cavity has a first window, and the first bottom end part is provided with an opening;
a second cavity, disposed inside the first cavity, and provided with a second top end part and a second bottom end part that are arranged opposite each other, wherein the second cavity has a second window and a sample bearer arranged on the second bottom end part to bear a sample;
a laser heating assembly, disposed outside the first cavity, wherein at least one laser beam provided by the laser heating assembly is passed through the first window and the second window, and then focused on the sample bearer;
a mobile platform assembly, comprising a platform and a mobile mechanism connected to the platform, wherein the platform is disposed below the second bottom end part, to bear the second cavity, and the mobile mechanism is disposed through the opening on the first bottom end part to raise/lower the platform; and
a cooling pipeline, disposed in the mobile platform assembly, communicated with the second cavity, and used to cool the sample;
wherein the first cavity is a vacuum cavity, and the pressure in the second cavity ranges from $10^{-6}$ atm to 30 atm.

2. The laser-heated cavity system according to claim 1, further comprising a sample transfer assembly, wherein the sample transfer assembly is provided with an input end coupled to the first lateral end part of the first cavity and an output end connected to the second lateral end part of the first cavity, and the input end is provided with a transfer rail and a transfer arm disposed on the transfer rail, to move the sample to the output end.

3. The laser-heated cavity system according to claim 1, further comprising a pressure regulating valve, connected to the first cavity to control the pressure inside the first cavity.

4. The laser-heated cavity system according to claim 1, wherein the first cavity also comprises a first gas inlet pipe and a first gas outlet pipe, and the second cavity also comprises a second gas inlet pipe and a second gas outlet pipe.

5. The laser-heated cavity system according to claim 1, wherein the first window is disposed on the first top end part, and the second window is disposed on the second top end part.

6. The laser-heated cavity system according to claim 1, wherein the laser heating assembly comprises:
at least two vertical cavity surface emitting lasers, used to vertically emit laser beams; and
a laser adjusting mechanism, connected to the vertical cavity surface emitting lasers to adjust an emission angle of the laser beam.

7. The laser-heated cavity system according to claim 6, wherein the laser adjusting mechanism comprises two fixing ends opposite to each other, which are used to fix the vertical cavity surface emitting lasers, such that the laser beams are mutually unparalleled.

8. The laser-heated cavity system according to claim 7, wherein the laser heating assembly comprises six vertical cavity surface emitting lasers that are arranged on the two opposite fixing ends in groups of three in an arc.

9. The laser-heated cavity system according to claim 1, wherein the first cavity is made from iron alloy which contains chrome whose content accounts for 10 wt % to 30 wt % of the total weight percentage.

10. A laser-heated cavity system, comprising:
a first cavity, provided with a first top end part and a first bottom end part that are arranged opposite each other, a first lateral end part between the first top end part and the first bottom end part, and a second lateral end part arranged opposite the first lateral end part, wherein the first cavity has a first window, and the first bottom end part is provided with an opening;
a second cavity, disposed inside the first cavity, and provided with a second top end part and a second bottom end part that are arranged opposite each other, wherein the second cavity has a second window and a sample bearer arranged on the second bottom end part to bear a sample;

a laser heating assembly, disposed outside the first cavity, wherein at least one laser beam provided by the laser heating assembly is passed through the first window and the second window, and then focused on the sample bearer;

a mobile platform assembly, comprising a platform and a mobile mechanism connected to the platform, wherein the platform is disposed below the second bottom end part, to bear the second cavity, and the mobile mechanism is disposed through the opening on the first bottom end part to raise/lower the platform; and a sample transfer assembly, wherein the sample transfer assembly is provided with an input end coupled to the first lateral end part of the first cavity and an output end connected to the second lateral end part of the first cavity, and the input end is provided with a transfer rail and a transfer arm disposed on the transfer rail, to move the sample to the output end;

wherein the first cavity is a vacuum cavity, and the pressure in the second cavity ranges from $10^{-6}$ atm to 30 atm.

11. A laser-heated cavity system, comprising:

a first cavity, provided with a first top end part and a first bottom end part that are arranged opposite each other, a first lateral end part between the first top end part and the first bottom end part, and a second lateral end part arranged opposite the first lateral end part, wherein the first cavity has a first window, and the first bottom end part is provided with an opening;

a second cavity, disposed inside the first cavity, and provided with a second top end part and a second bottom end part that are arranged opposite each other, wherein the second cavity has a second window and a sample bearer arranged on the second bottom end part to bear a sample;

a laser heating assembly, disposed outside the first cavity, wherein at least one laser beam provided by the laser heating assembly is passed through the first window and the second window, and then focused on the sample bearer; and a mobile platform assembly, comprising a platform and a mobile mechanism connected to the platform, wherein the platform is disposed below the second bottom end part, to bear the second cavity, and the mobile mechanism is disposed through the opening on the first bottom end part to raise/lower the platform;

wherein the first cavity is a vacuum cavity, and the pressure in the second cavity ranges from $10^{-6}$ atm to 30 atm;

wherein the first cavity is made from iron alloy which contains chrome whose content accounts for 10 wt % to 30 wt % of the total weight percentage.

* * * * *